US011287499B2

(12) United States Patent
Heidemann et al.

(10) Patent No.: US 11,287,499 B2
(45) Date of Patent: Mar. 29, 2022

(54) SYSTEMS AND METHODS FOR SEGMENT-SPECIFIC DATA ACQUISITION IN READOUT-SEGMENTED MAGNETIC RESONANCE IMAGING (71) Applicant: Siemens Healthcare GmbH, Erlangen (DE)

(72) Inventors: Robin Heidemann, Litzendorf (DE); Patrick Liebig, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 1 day.

(21) Appl. No.: 16/743,110

(22) Filed: Jan. 15, 2020

(65) Prior Publication Data
US 2020/0225303 A1 Jul. 16, 2020

(30) Foreign Application Priority Data

Jan. 15, 2019 (EP) .................................. 19151853

(51) Int. Cl.
*G01R 33/48* (2006.01)
*G01R 33/56* (2006.01)
*G01R 33/561* (2006.01)

(52) U.S. Cl.
CPC ..... *G01R 33/4818* (2013.01); *G01R 33/5608* (2013.01); *G01R 33/5611* (2013.01)

(58) Field of Classification Search
CPC ............ G01R 33/4818; G01R 33/5608; G01R 33/5611
See application file for complete search history.

(56) References Cited

U.S. PATENT DOCUMENTS

| 7,417,427 | B2 * | 8/2008 | Porter ................ G01R 33/5615 324/306 |
| 8,461,840 | B2 * | 6/2013 | Stemmer ............ G01R 33/5611 324/309 |
| 8,760,163 | B2 * | 6/2014 | Frost ................ G01R 33/56341 324/318 |
| 10,809,341 | B1 * | 10/2020 | Sharma .............. G01R 33/5676 |
| 2005/0237057 | A1 * | 10/2005 | Porter .............. G01R 33/56341 324/307 |
| 2010/0237865 | A1 | 9/2010 | Stemmer |
| 2013/0033262 | A1 | 2/2013 | Porter |

(Continued)

FOREIGN PATENT DOCUMENTS

EP 2077454 A1 7/2009

OTHER PUBLICATIONS

Griswold et al.: "Rapid Evaluation of Cardiac Function Using Undersampled Radial TrueFISP with GRAPPA" Proceedings of the International Society for Magnetic Resonance in Medicine; ISMRM; 12th Scientific Meeting and Exhibition; Kyoto, Japan; May 15-21, 2004; May 1, 2004; XP040590578; 2004.

(Continued)

*Primary Examiner* — G. M. A Hyder
(74) *Attorney, Agent, or Firm* — Schiff Hardin LLP (57) ABSTRACT In a method for readout segmented magnetic resonance imaging (MRI) of an examination object, k-space is acquired in a plurality of segments along a readout direction using a parallel imaging (PI) technique. K-space in a first segment is acquired with a first acceleration factor, and k-space in a second segment is acquired with a second acceleration factor different from the first acceleration factor.

20 Claims, 8 Drawing Sheets (56) References Cited

U.S. PATENT DOCUMENTS

2015/0253408 A1* 9/2015 Grodzki .............. G01R 33/543
                                                          324/309
2018/0017655 A1* 1/2018 Zeller ................. G01R 33/583

OTHER PUBLICATIONS

Samantha J. Holdsworth et al: "Robust GRAPPA-accelerated diffusion-weighted readout-segmented (RS)-EPI"; Magnetic Resonance in Medicine; vol. 62; No. 6; Dec. 1, 2009; pp. 1629-1640; XP055388894; US; ISSN: 0740-3194; DOI: 10.1002/mrm.22122; 2009.
David A Porter et al: "High resolution diffusion-weighted imaging using readout-segmented echo-planar imaging; parallel imaging and a two-dimensional navigator-based reacquisition"; Magnetic Resonance in Medicine; vol. 62; No. 2; May 15, 2009; pp. 468-475; XP055130037; ISSN: 0740-3194; DOI: 10.1002/mrm.22024; 2009.
European Search Report dated Jul. 8, 2019 for Application No. 19151853.9.

\* cited by examiner

SYSTEMS AND METHODS FOR SEGMENT-SPECIFIC DATA ACQUISITION IN READOUT-SEGMENTED MAGNETIC RESONANCE IMAGING

CROSS REFERENCE TO RELATED APPLICATIONS

This patent application claims priority to European Patent Application No. 19151853.9, filed Jan. 15, 2019, which is incorporated herein by reference in its entirety.

BACKGROUND

Field

The present disclosure relates to a method for readout (RO)-segmented magnetic resonance imaging (MRI), including a method for RO-segmented MRI using a parallel imaging technique.

Related Art

Parallel imaging (PI) techniques like Echo Planar Imaging (EPI) are well established in clinical MRI due to fast data acquisition, particularly in the field of diffusion-weighted MRI. Since in EPI the entire k-space is acquired after only one excitation, such an EPI echo train may be relatively long compared to other acquisition methods, resulting in typical quality problems such as image distortion, signal cancellation and resolution loss. Therein, single-shot EPI sequences react very sensitively to so-called "off-resonance effects". Off-resonance means that spins outside the excited layer contribute to the MR signal. This may lead to artifacts in the image. This data shift grows with the effective echo spacing and the length of the echo train.

In addition to improved gradients, parallel imaging (PI) methods in combination with Partial Fourier techniques have been introduced to RO segmented MRI. However, with high resolutions, e.g. of less than 1 mm, these methods will exhibit convolution artifacts and/or increased image noise.

In order to reduce these MR image quality problems, echo trains may be shortened by segmented scanning of the measurement matrix, thereby the shift in phase coding direction is reduced, thus reducing the visible artifact.

According to conventional segmentation methods, k-space is not acquired completely after a single excitation, but instead the echo train is divided, i.e. a small section, a so-called segment, of k-space is acquired after each of a plurality of excitations. For example, k-space may be divided into several segments along the readout direction, this is referred to as readout (RO)-segmented MRI. REadout Segmentation Of Long Variable Echotrains (RESOLVE) is described in U.S. Patent Application Publication No. 2013033262 A1 and has been successfully applied in clinical diffusion-weighted MRI.

Further, RO-segmented MRI may be combined with parallel imaging (PI) techniques as described in the document "High resolution diffusion-weighted imaging using readout-segmented echo-planar imaging, parallel imaging and a two-dimensional navigator-based reacquisition" by David A. Porter and Robin M. Heidemann in Magnetic Resonance in Medicine: An Official Journal of the International Society for Magnetic Resonance in Medicine 62.2 (2009): 468-475.

Other conventional methods for reducing the measurement time in RO-segmented MRI are RO partial Fourier techniques. According to RO partial Fourier techniques, outer segments of k-space are not acquired on one or more sides relative to k-space center, and subsequently, the POCS or Margosian method is used to reconstruct k-space in these outer segments, as well known to a person skilled in the art.

Since k-space is acquired in several shots, or in other words several excitations, during RO segmented MRI, total measurement time is extended accordingly, which can still be problematic in specific clinical applications. MR image quality problems due to off-resonances in the above conventional methods may lead to false diagnoses or non-diagnosable MR images in clinical applications.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure.

Aspects of the present disclosure include an improved methods for RO-segmented MRI using parallel imaging (PI) data acquisition. Advantageously, exemplary methods provide a shorter total measurement time and at the same time high MR image quality with regard to distortions and convolution artefacts.

According to a first aspect of the disclosure, a method for readout segmented magnetic resonance imaging (MRI) of an examination object is provided. Therein, k-space is acquired in a plurality of segments along readout direction using a parallel imaging (PI) technique, i.e. the complete k-space is divided into a plurality of segments, wherein in each of the plurality of segments k-space is acquired separately per excitation.

In an exemplary embodiment, in a first step, k-space in a first segment is acquired, wherein k-space in the first segment is undersampled with a first acceleration factor, in other words k-space is undersampled with a first acceleration factor using a parallel imaging (PI) technique as known in the art. In a further step, k-space in a second segment is acquired, wherein k-space in the second segment is undersampled with a second acceleration factor, different from the first acceleration factor. In another step, and MR image of the examination object is generated based at least on k-space acquired in the first and in the second segment.

By acquiring k-space separately in at least two segments, wherein the acceleration factors with which k-space is acquired differ from each other in the at least two segments, measurement time for acquiring k-space in order to generate an MR image of the examination object may be reduced in comparison to conventional RO segmented MRI methods, wherein k-space in each segment is acquired with the same acceleration factor.

Thereby, an improved method for RO-segmented MRI using a parallel imaging (PI) technique is provided, which has a shorter total measurement time and, at the same time, high MR image quality with regard to distortions and convolution artefacts, thus enabling reliable medical diagnoses in clinical applications.

K-space in the first segment may be acquired with a first echo spacing, and k-space in the second segment may be acquired with a second echo spacing, wherein the first and the second echo spacing are different from each other. The first echo spacing and the second echo spacing may have substantially the same ratio as the first acceleration factor and the second acceleration factor, i.e. the same ratio within the present disclosure may mean that the first echo acceleration factor divided by the second acceleration factor may have substantially the same value as the first echo spacing divided by the second echo spacing. In more general terms, a higher acceleration factor in a segment may correspond to a higher echo spacing in the same segment.

Performing data acquisition in the RO segments with different echo spacings allows for an adaption of the effective echo spacing in each of the segments. Thereby, MR image distortions e.g. due to off-resonance effects, which are influenced by the effective echo spacing, may be reduced, thus enabling a higher MR image quality. Choosing the ratio of the first and the second echo spacing such that they have substantially the same ratio as the first and the second acceleration factor leads to similar distortions in each of the segments, and therefore low overall distortions in the resulting MR image.

K-space in the first segment may have a first segment width in readout direction, wherein the segment width in readout direction refers to the dimension of the segment in readout direction in k-space. K-space in the second segment may have second segment width, which may be different from the first segment width. The first segment width and the second segment width may have substantially the same ratio as the first acceleration factor and the second acceleration factor.

Choosing the segment widths of the first and the second segment differently, in some embodiments according to the ratio of the first and the second acceleration factors, allows for an accelerated k-space acquisition and for adjusting of the echo spacing in each of the segments, such that the overall measurement time of complete k-space may be further reduced, wherein MR image quality problems e.g. due to off-resonance effects may be further reduced.

In the segment with a higher acceleration factor, and/or with a greater echo spacing and/or a greater segment width, more k-space measurements points may be acquired per echo, or in other words in each line of k-space in readout direction, more k-space data points may be acquired per echo, compared to the number of k-space data points acquired in the segment with a lower segment width. Thereby, the overall measurement time of complete k-space may be reduced by adjusting the segment width of the segments, such that lower number of segments is needed to acquire the complete k-space.

An outer segment farther away from k-space center in readout direction may have at least one of a higher acceleration factor, a longer echo spacing, and a bigger segment width, compared with an inner segment closer to k-space center in readout direction. K-space of an outer segment may be acquired with a higher acceleration factor and the outer segment may have bigger segment width, compared with an inner segment, relative to k-space center in readout direction. Likewise, the segment with a higher acceleration factor may be located further away from k-space center, such that the artifacts due to parallel imaging reconstruction are mostly in the high frequency domain, resulting in a shorter measurement time with higher MR image quality. In some examples, the acceleration factor of two or more segments, or of all outer segments, may be higher compared to inner segments, and likewise the echo spacing and/or segment width of all outer segments may be higher compared to the inner segments.

In general terms, segment-specific data acquisition in readout-segmented MRI described, wherein two or more segments, or all segments, in the RO-segmented MRI may have varying acceleration factors and/or varying echo spacings and/or varying, and/or varying segment widths, in other words, these parameters may be different of each other, or adapted to each other by having substantially the same ratios, in order to provide a short overall measurement time and high MR image quality. Segments with the same distance, i.e. the same position, relative to k-space center in read-out direction, may have the same acceleration factors, echo spacing and/or segment widths.

In an exemplary embodiment, the step of generating an MR image of the examination object includes reconstructing fully sampled k-space in each of the first and the second segment, combining the reconstructed k-space in at least the first and the second segment to obtain complete k-space, and subsequently generating an MR image of the examination object based on the combined complete k-space. The MR image may be generated using a general regularization method, in particular a Compressed Sensing reconstruction method. Reconstructing k-space in each of the segments separately, combining the reconstructed k-space segments in order to generate the MR image using a general regularization method, allows for further improving MR image quality by filtering out the folding artifacts which are mainly in the high frequency domain.

The readout-segmented MR imaging method may be a readout-segmented echo-planar imaging (EPI) method, and/or may be a diffusion-weighted MR imaging method.

The parallel imaging (PI) technique may be a partially parallel acquisition (PPA) technique, in particular a Generalized Autocalibrating Partially Parallel Acquisition (GRAPPA) technique.

The readout-segmented MR imaging method may be a High Resolution Diffusion-Weighted Imaging Using Readout-Segmented Echo-Planar Imaging, Parallel Imaging and a Two-Dimensional Navigator-Based Reacquisition (RESOLVE) method, as known to a person skilled in the art.

According to another aspect of the disclosure, a MR imaging system is provided, which is configured for readout-segmented MR imaging of an examination object. Therein, k-space is acquired in a plurality of segments along readout direction using a parallel imaging (PI) technique, as described under the first aspect of the disclosure. In an exemplary embodiment, the MR imaging system comprises a controller including a computer with a memory and at least one processor, the memory containing instructions to be executed by said at least one processor, wherein when executing the instructions the computer is operative for performing the following steps. In an exemplary embodiment, in a first step, k-space in a first segment is acquired, wherein k-space in the first segment is undersampled with a first acceleration factor, in particular k-space is undersampled with a first acceleration factor using a parallel imaging (PI) technique as known in the art. In a further step, k-space in a second segment is acquired, wherein k-space in the second segment is undersampled with a second acceleration factor, different from the first acceleration factor. In another step, an MR image of the examination object is generated based at least on k-space acquired in the first and in the second segment.

In an exemplary embodiment, the MR imaging system is configured to perform a method for readout-segmented MR imaging of the examination object as described under the first aspect of the disclosure.

According to a further aspect, a computer is provided, which is configured to perform readout-segmented MR imaging of an examination object. In an exemplary embodiment, the computer includes a memory, and at least one processor, the memory containing instructions executable by said at least one processor, wherein execution of the instructions causes the computer to execute a method for readout-segmented MR imaging of an examination object as described under the first aspect of the disclosure.

According to a further aspect of the disclosure, a computer program product is provided, which comprises program code to be executed by at least one processor of a computer. Therein, the execution of the program code causes the at least one processor to execute a method for readout-segmented MR imaging of an examination object as described under the first aspect of the disclosure.

For such a MR imaging system, computer, and computer program product for RO-segmented MRI, technical effects can be achieved, which correspond to the technical effects described under the first aspect of the disclosure.

Although features of the disclosure are described in connection with specific embodiments and aspects of the present disclosure, it should be understood that the features of the exemplary embodiments and aspects may be combined with each other, and correlate to each other, unless specifically noted otherwise.

Therefore, the above summary is merely intended to give a short overview over some features of some embodiments and implementations and is not to be construed as limiting. Other embodiments may comprise other features than the ones explained above.

Figure 1:
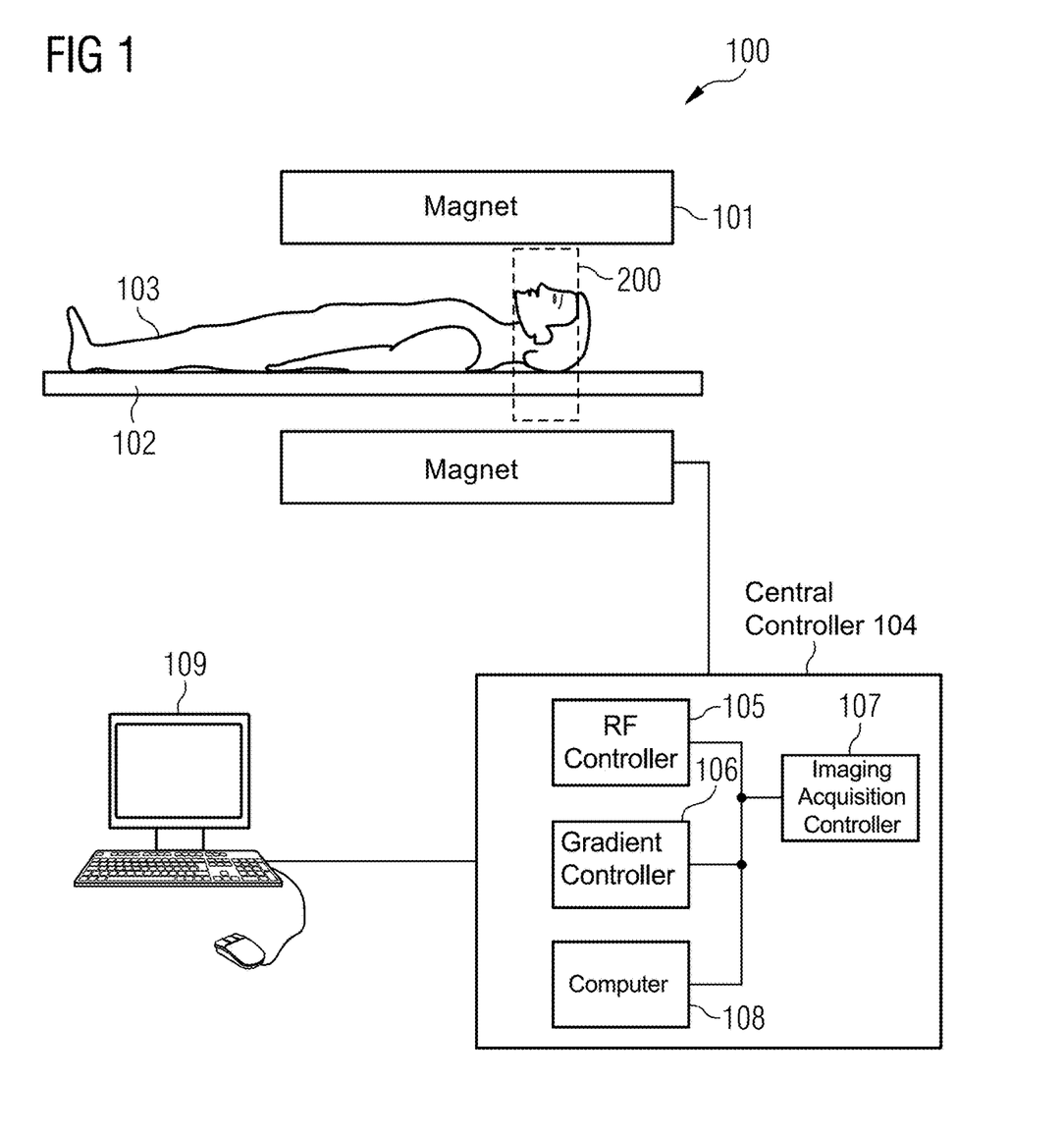
FIG. 1 illustrates a MR imaging system according to exemplary embodiments of the disclosure.

FIG. 1 schematically illustrates an MR imaging system 100 according to an exemplary embodiment of the present disclosure. In an exemplary embodiment, the MR imaging system 100, which is configured for RO-segmented MRI using a parallel imaging (PI) technique, has a basic field magnet 101 that generates a polarization field BO. An examination person 103, or in general terms an examination object 103, is arranged on a bed 102 and driven into the center of the basic field magnet 101 where the acquisition of the MR signals from an examination region 200 is implemented via radiation of excitation RF pulses and switching of gradients. How MR images—in particular, images of multi-gradient echo sequences—can be generated in a pulse sequence with a series of RF pulses and switching of gradients, in particular according to a RO-segmented MRI technique using a parallel imaging (PI) technique, is known to those skilled in the art and need not be described herein in further detail.

In an exemplary embodiment, the MR imaging system 100 is connected with a central controller 104 with which the MR system 100 is controlled. In an exemplary embodiment, among other things, the central controller 104 includes a Radio Frequency (RF) controller 105, which controls the switching of the RF pulses to excite the magnetization. A gradient controller 106 controls the switching of the gradient magnetic fields for spatial coding of the excited spins. An imaging acquisition controller 107 controls the workflow of the gradient switching, the RF pulses, and the MR signal readout depending on a selected imaging sequence.

A computer 108 is configured to process MR signals and calculates MR images and phase evolutions of the MR signals in a known manner via Fourier transformation from the MR signals detected with a plurality of coils (not shown), which images and evolutions can be displayed on a display of computer interface 109. The MR imaging system 100 can be controlled by an operator. The other typical components of an MR system have been omitted for clarity. The method steps described in the following in connection with FIG. 1 can for example be implemented with the aid of the computer 108 or a processor integrated into the computer interface 109. The computer interface 109 can include one or more input (e.g. keyboard, mouse, etc.) and/or output (e.g. display, printer, etc.) devices that facilitate a user to interact with the computer interface 109. In an exemplary embodiment, the controller 104 includes processor circuitry that is configured to perform one or more operations and/or functions of the controller 104. In an exemplary embodiment, one or more components 105-108 of the controller 104 include processor circuitry that is configured to perform one or more receptive component operations and/or functions.

Figure 2:
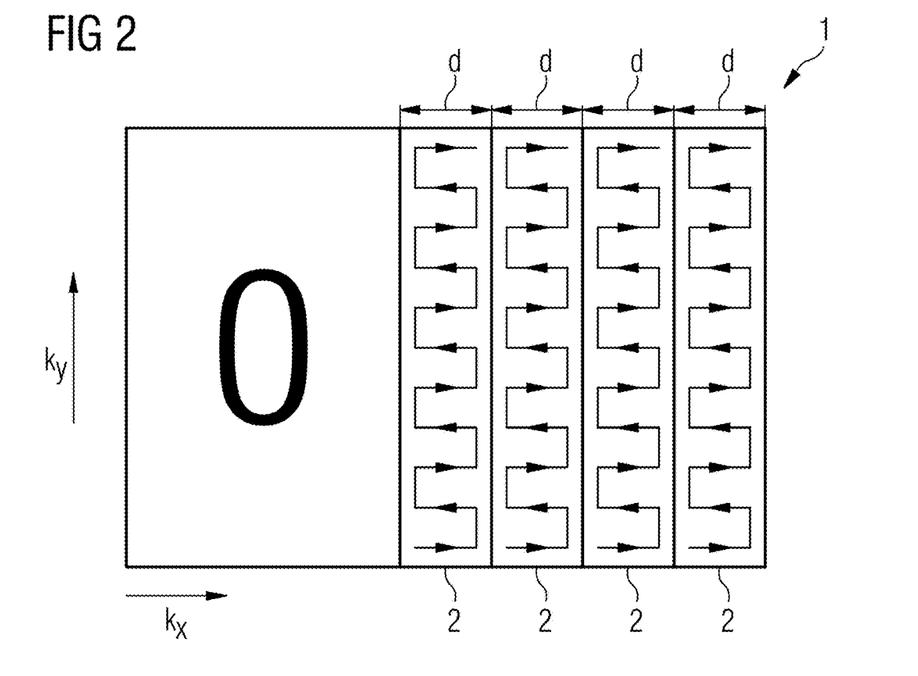
FIG. 2 illustrates a conventional RO-segmented Partial Fourier technique using a parallel imaging technique with four excitations and acceleration factor 3 in PE direction.

FIG. 2 illustrates a conventional RO-segmented Partial Fourier technique using a parallel imaging technique with four excitations and acceleration factor 3 in PE direction.

As can be seen in FIG. 2, k-space 1 on the right side relative to k-space center is divided into a plurality of segments 2 along readout direction, wherein each of segments 2 has a segment width d. In all Figures, $k_x$ direction from left to right is the readout direction, and $k_y$ direction directed upwards is phase encoding (PE) direction. According to FIG. 2, in each of RO segments 2 k-space is acquired separately using at least one separate excitation, wherein the central segment 2 may comprise k-space center. In this RO partial Fourier technique outer segments of the k-space 1 are not acquired on the left side relative to k-space center, wherein these data points of the unacquired segments are replaced by zeros. Subsequently, these data points are reconstructed using a POCS or Margosian technique. The partial Fourier technique as known in the art may in some embodiments be combined with the RO-segmented MRI techniques according to the disclosure, such that one or more, or all, segments on one side of k-space center are not acquired, replaced with zeros, and further reconstructed using a POCS or Margosian technique as known in the art. In other words, the RO-segmented MRI method may be a RO Partial Fourier technique, wherein the acquired segments have varying acceleration factors and/or echo spacings and/or segment widths, as described in detail under the first aspect of the disclosure.

Figure 3:
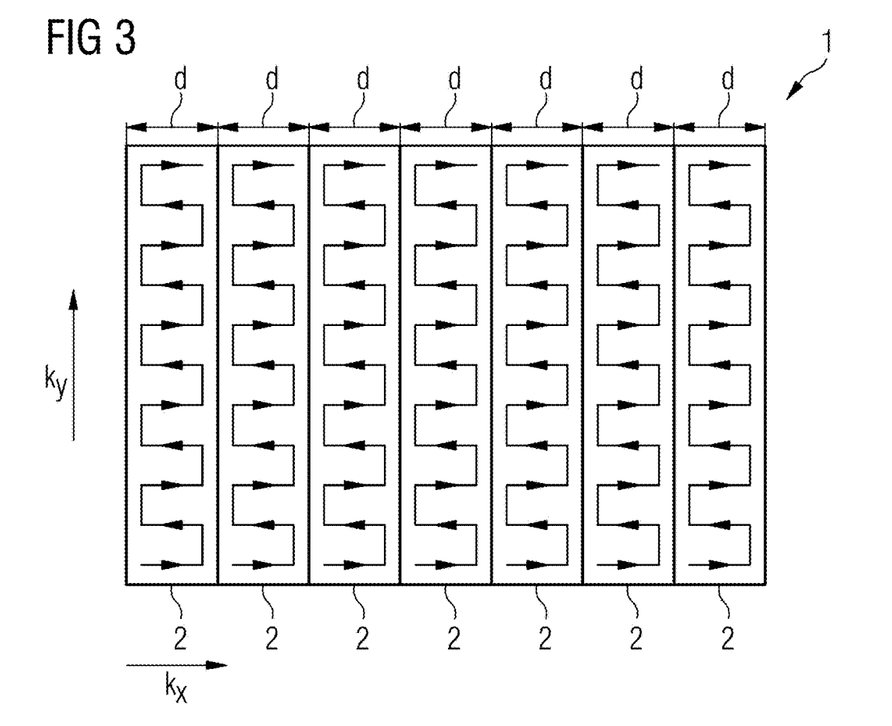
FIG. 3 illustrates a conventional RO-segmented technique using a parallel imaging technique with seven excitations and acceleration factor 3 in PE direction.

FIG. 3 illustrates a conventional RO-segmented technique using a parallel imaging technique with seven excitations and acceleration factor 3 in PE direction.

As can be seen in FIG. 3, k-space 1 is divided into seven segments 2 in readout direction. Each of the seven segments 2 has the same segment width d, and in each segment 2 k-space is acquired using a parallel imaging technique with the same acceleration factor 3. Therefore, at least seven separate excitation pulses are needed to acquire the complete k-space 1 in the segments 2.

Figure 4:
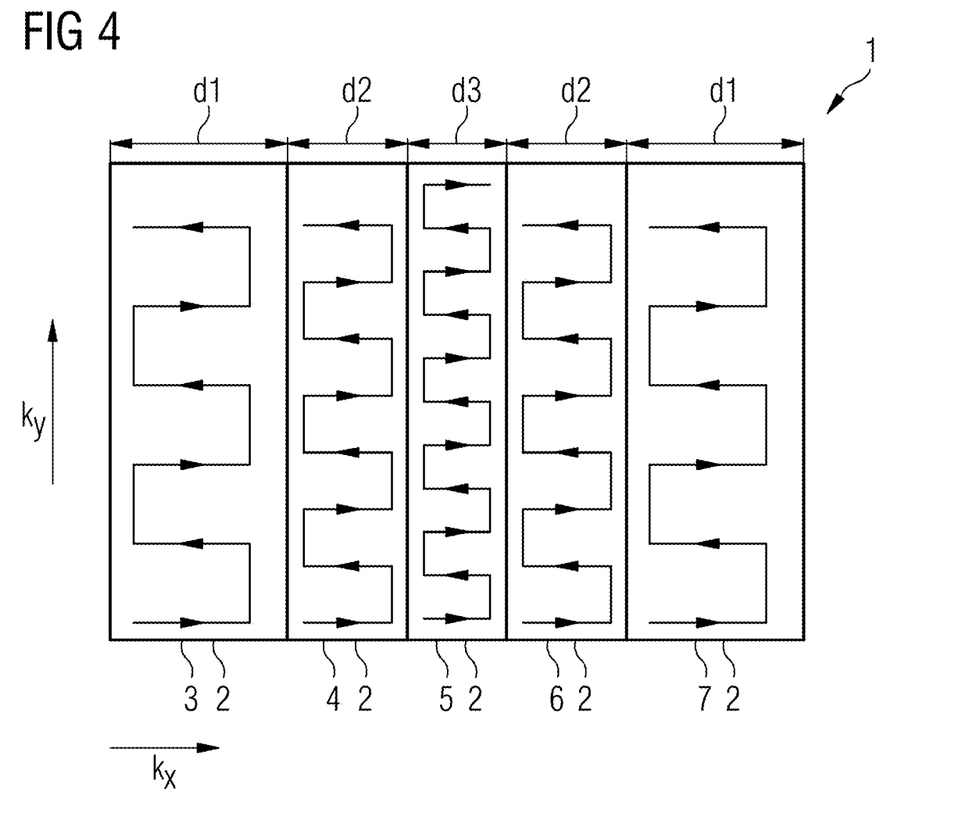
FIG. 4 illustrates a RO-segmented MRI technique using parallel imaging data acquisition with five excitations and variable segment width, according to exemplary embodiments of the disclosure.

FIG. 4 illustrates a RO-segmented MRI technique using parallel imaging with 5 excitations and variable acceleration factor and segment width, according to exemplary embodiments of the disclosure.

According to a general concept of the disclosure, the outer segments in k-space are more strongly undersampled than inner segments. In some embodiments, echo spacings and acceleration factors dependent on the segment number, or segment position, relative to k-space center are used for RO-segmented diffusion-weighted imaging.

As depicted in FIG. 4, k-space 1 is divided into a plurality of segments 3, 4, 5, 6, 7 in readout direction, i.e. $k_x$ direction. It is to be understood, that any other number of segments can be used to divide k-space, and acquire data points in each segment separately using several excitations.

In the example of FIG. 4, the two outermost segments 3, 7 are undersampled with acceleration factor 5, the adjacent segments 4, 6 are undersampled with acceleration factor 4, and the central segment 5 is undersampled with acceleration factor 3. Therefore, in this embodiment, segments 3, 7 and 4, 6 with the same distance, i.e. the same position, relative to k-space center in read-out direction, have the same acceleration factors and same segment widths.

In the embodiment of FIG. 4, echoes with different echo distance, i.e. the time from echo center to echo center, in k-space would be combined. In image space, this would mean combining image contents with different EPI typical distortions, resulting in superposed MR image artifacts. Therefore, in order to keep the effective echo distance (echo distance divided by the acceleration factor) constant, the echoes of the outer segments 3, 4, 6, 7 are extended according to their acceleration factors. In the embodiment the segment width in $k_x$-direction of these segments is increased, whereby more data points per excitation are acquired.

As depicted in FIG. 4, segments 3, 7 have segment width d1, segments 4, 6 have segment width d2, and the central segment 5 has segment width d3. The central segment 5 comprising k-space center may also be referred to as an inner segment within meaning of this disclosure. With the same measurement resolution, this means that fewer segments are required to scan the same extension in $k_x$-direction in k-space. Since the acceleration factor is only increased in the outer segments, mainly high-frequency convolution artifacts occur. These have less signal, so they are not as prominent as low-frequency convolution artifacts and behave more like noise, making it possible to filter them out in the reconstruction using a general regularization method, in particular a compressed sensing method.

According to some embodiments, an outer segment 3, 4, 6, or 7 located farther away from k-space center in readout direction compared to one of the other segments may have at least one of a higher acceleration factor, a longer echo spacing, and a bigger segment width. In other words, k-space of an outer segment may be acquired with a higher acceleration factor and the outer segment may have bigger segment width, compared with an inner segment, relative to k-space center in readout direction. Likewise, segments with a higher acceleration factor, e.g. segment 4 compared to segment 5, or segment 3 compared to segment 4 is located further away from k-space center, such that the artifacts that could be caused by parallel imaging reconstruction are mostly in the high frequency domain. In some examples, the acceleration factor of 2 or more outer segments, or of all outer segments, may be higher compared to an inner segment, and likewise the echo spacing and/or segment width of these outer segments may be higher compared to the inner segment.

Figure 5:
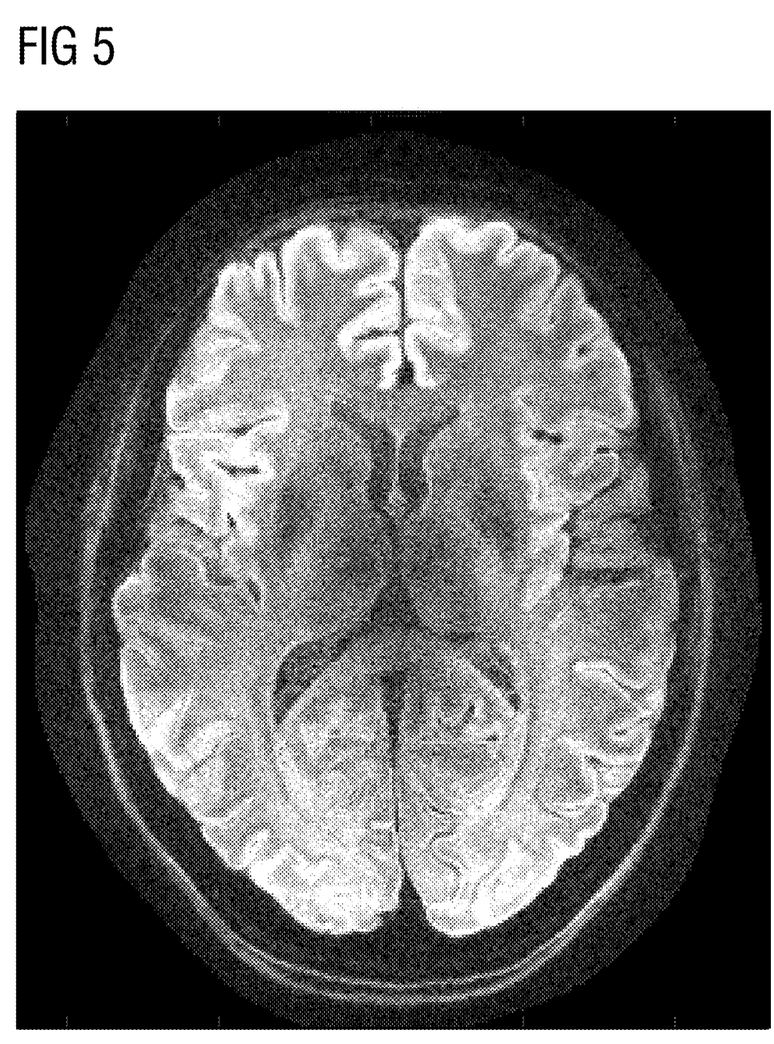
FIG. 5 illustrates a MR image generated according to the conventional method shown in FIG. 3.

FIG. 5 illustrates a MR image generated according to the conventional method shown in FIG. 3. MR image artifacts and distortions can be noticed on the left side in the white areas.

Figure 6:
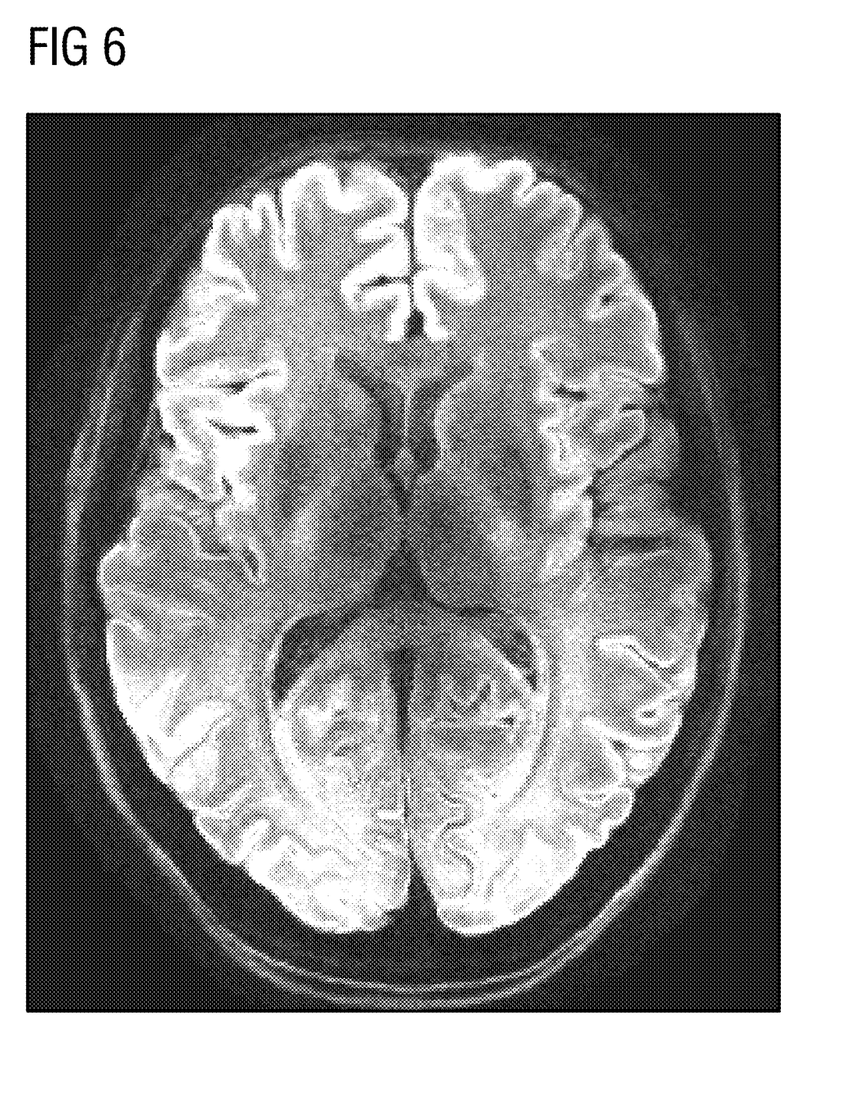
FIG. 6 illustrates a MR image generated according to the method of disclosure shown in FIG. 4.

FIG. 6 illustrates a MR image generated according to the method of disclosure shown in FIG. 4, which shows significantly less image artifacts and distortions on the left side in the white areas.

Figure 7:
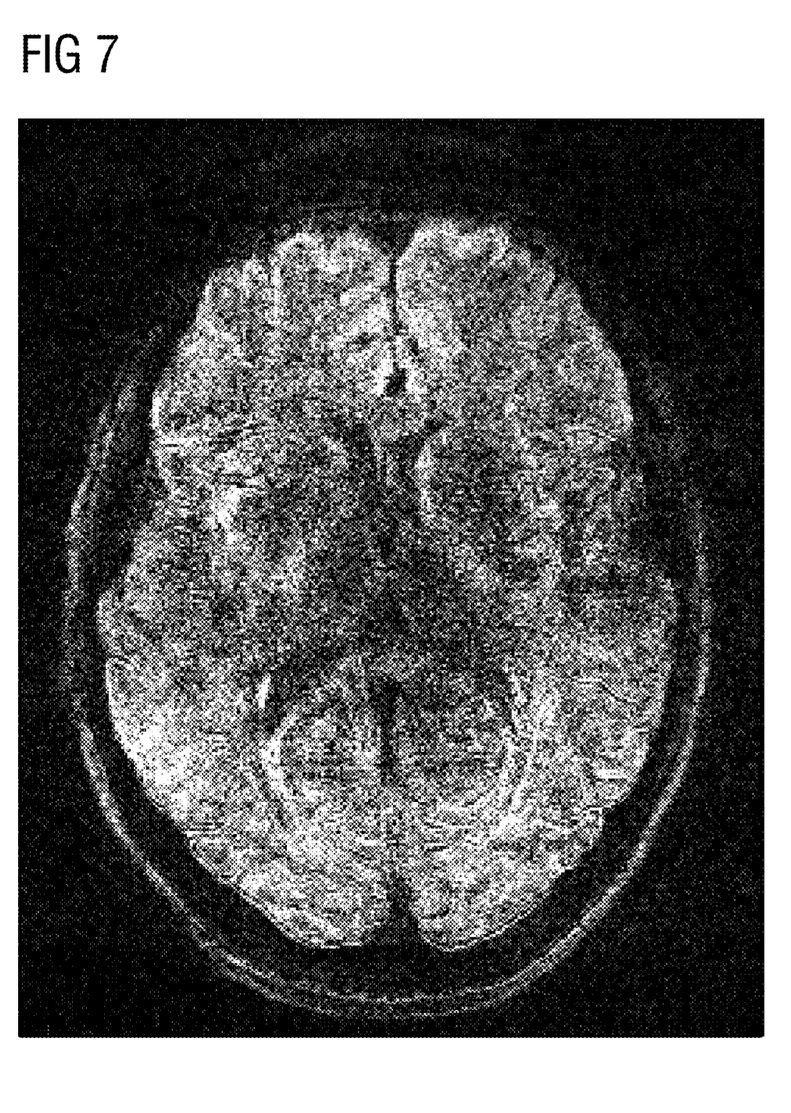
FIGS. 7 and 8 illustrate a difference picture between the reference fully acquired acquisition and the conventional MR image of FIG. 5 and the MR image according to the disclosure of FIG. 6, respectively.
Figure 8:
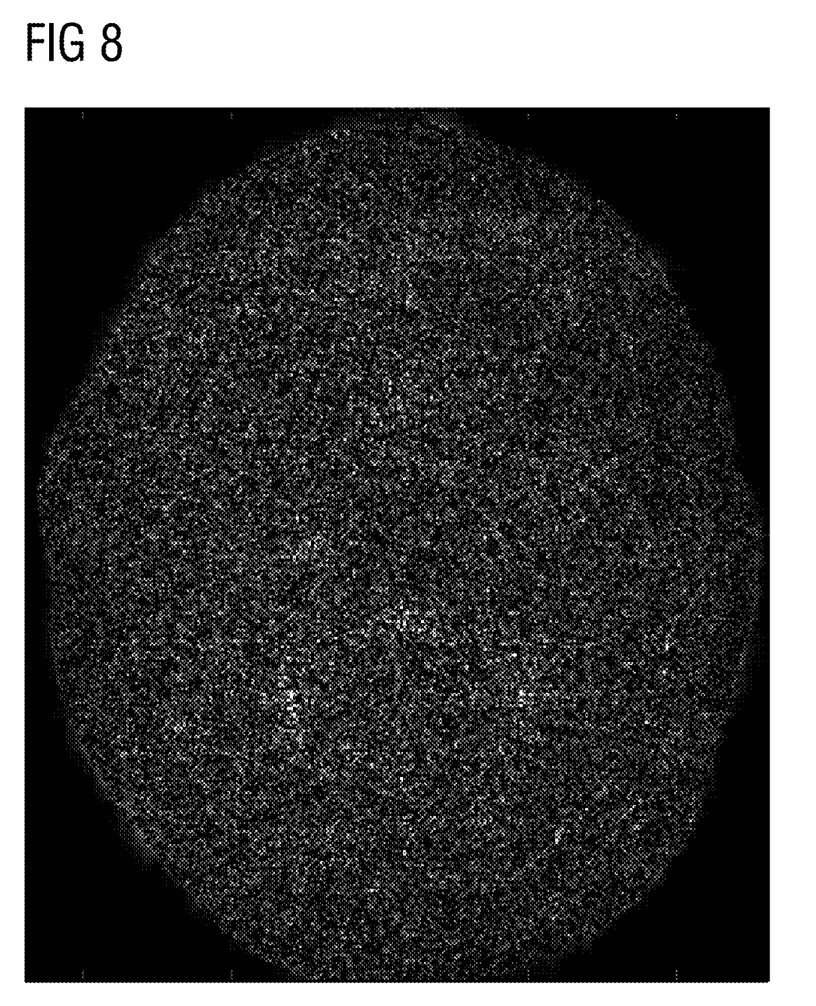

FIGS. 7 and 8 illustrate a difference picture between a reference fully acquired acquisition and the conventional MR image of FIG. 5 and the MR image according to the disclosure of FIG. 6, respectively. As can be seen by comparing FIGS. 7 and 8, the MR image according to the disclosure has better image quality by reduced noise level.

Figure 9:
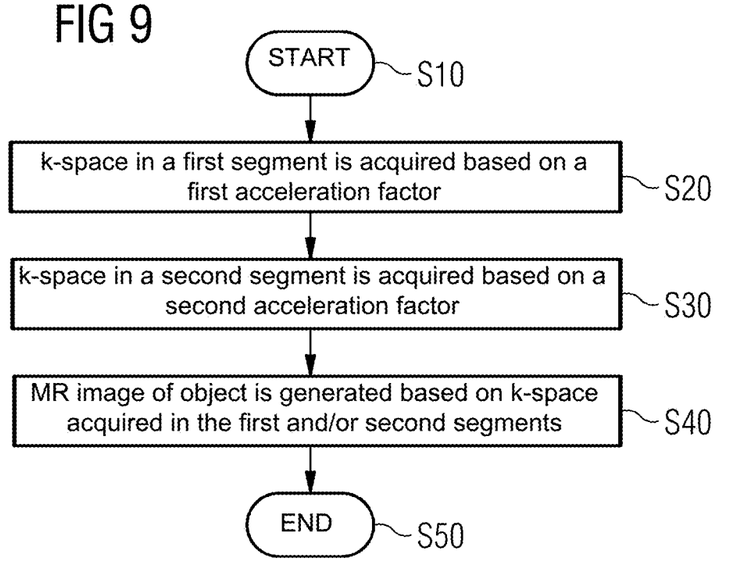
FIG. 9 illustrates a flow chart of a method for RO-segmented MRI using parallel imaging, according to an exemplary embodiment of the present disclosure.

FIG. 9 illustrates a flow chart of a method for RO-segmented MRI using parallel imaging (PI), according to exemplary embodiments of the disclosure. K-space is acquired in a plurality of segments 2 along readout direction using a parallel imaging (PI) technique. The method starts in step S10. In an exemplary embodiment, in step S20, k-space in a first segment is acquired. In an exemplary embodiment, k-space in the first segment is undersampled with a first acceleration factor. In step S30, k-space in a second segment is acquired. In an exemplary embodiment, k-space in the second segment is undersampled with a second acceleration factor, different from the first acceleration factor. In step S40, and MR image 8 of the examination object is generated based at least on k-space acquired in the first and in the second segment. The method ends in step S50.

In aspects of the disclosure, in the field of MRI, an inventive method for segment-specific data acquisition in RO-segmented MRI using parallel imaging (PI) is provided. In an exemplary aspect, two or more segments have different acceleration factors, varying echo spacings and/or varying segment widths. Thereby, the improved method according to the embodiments of the disclosure advantageously provide a shorter total measurement time for an MR image and at the same time high MR image quality for more reliable medical diagnoses in clinical applications.

Any connection or coupling between functional blocks, devices, components of physical or functional units shown in the drawings and described hereinafter may be implemented by an indirect connection or coupling. A coupling between components may be established over a wired or wireless connection. Functional blocks may be implemented in hardware, software, firmware, or a combination thereof.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. A circuit includes an analog circuit, a digital circuit, state machine logic, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for readout-segmented magnetic resonance imaging (MRI) of an examination object using an MRI system including an MRI scanner and a controller, k-space being acquired in a plurality of segments along a readout direction using a parallel imaging (PI) technique, the method comprising:
    acquiring, using the MRI system, k-space in a first segment of the plurality of segments, k-space in the first segment being undersampled with a first acceleration factor;
    acquiring, using the MRI system, k-space in a second segment of the plurality of segments, k-space in the second segment being undersampled with a second acceleration factor different from the first acceleration factor, wherein the first segment and the second segment are in a non-overlapping arrangement with respect to the readout direction; and
    generating, by the MRI system, an MR image of the examination object based at least on k-space acquired in the first segment and the second segment.

2. The method according to claim 1, wherein:
    k-space in the first segment is acquired with a first echo spacing; and
    k-space in the second segment is acquired with a second echo spacing different from the first echo spacing.

3. The method according to claim 2, wherein a ratio of the first echo spacing and the second echo spacing is the same as a ratio of the first acceleration factor and the second acceleration factor.

4. The method according to claim 1, wherein:
    the first segment includes a first segment width in the readout direction; and
    the second segment includes a second segment width in the readout direction, the first segment width being different from the second segment width.

5. The method according to claim 4, wherein a ratio of the first segment width and the second segment width is the same as a ratio of the first acceleration factor and the second acceleration factor.

6. The method according to claim 1, wherein more k-space data points are acquired per echo in a segment of the first and second segments with a higher acceleration factor of the first and second acceleration factors.

7. The method according to claim 1, wherein an outer segment of the first and second segments that is further away from k-space center in the readout direction has at least: a higher acceleration factor, a longer echo spacing, and/or a larger segment width, as compared to an inner segment of the first and second segments that is closer to k-space center in the readout direction or that includes k-space center.

8. The method according to claim 1, wherein:
    k-space of an outer segment of the first and second segments that is acquired with a higher acceleration factor, and
    the outer segment has a larger segment width, compared with an inner segment of the first and second segments, relative to k-space center in the readout direction.

9. The method according to claim 1, wherein generating the MR image of the examination object comprises:
reconstructing a fully sampled k-space in each of the first and the second segments;
combining the reconstructed k-space in at least the first and the second segments to obtain a complete k-space; and
generating the MR image of the examination object based on the complete k-space.

10. The method according to claim 1, wherein the MR image is generated using a general regularization method.

11. The method according to claim 10, wherein the general regularization method is a Compressed Sensing reconstruction method.

12. The method according to claim 1, wherein the readout-segmented MR imaging method is a readout-segmented echo-planar imaging (EPI) method.

13. The method according to claim 1, wherein the readout-segmented MR imaging method is a diffusion-weighted MR imaging method.

14. The method according to claim 1, wherein the parallel imaging technique is a Partially Parallel Acquisition (PPA) technique.

15. The method according to claim 14, wherein the PPA technique is a GeneRalized Autocalibrating Partially Parallel Acquisition (GRAPPA) technique.

16. The method according to claim 1, wherein the readout-segmented MR imaging method is a REadout Segmentation Of Long Variable Echotrains (RESOLVE) method.

17. A non-transitory computer-readable storage medium with an executable program stored thereon, that when executed, instructs a processor to perform the method of claim 1.

18. A computer program product having a computer program which is directly loadable into a memory of the controller of the MRI system, when executed by the controller, causes the magnetic resonance tomography system to perform the method as claimed in claim 1.

19. A magnetic resonance (MR) imaging system configured for readout-segmented MR imaging of an examination object, k-space being acquired in a plurality of segments along a readout direction using a Parallel Imaging (PI) technique, the MR imaging system comprising a controller configured to perform the method according to claim 1.

20. A magnetic resonance (MR) imaging system configured for readout-segmented MR imaging of an examination object, k-space being acquired in a plurality of segments along a readout direction using a Parallel Imaging (PI) technique, the MR imaging system comprises:
a MR scanner configured to acquire MR image data from the examination object; and
a controller including a memory and at least one processor, the memory containing instructions to be executed by the at least one processor, wherein when executing the instructions, the processor is configured to:
acquire k-space in a first segment of the plurality of segments, k-space in the first segment being undersampled with a first acceleration factor;
acquire k-space in a second segment of the plurality of segments, k-space in the second segment being undersampled with a second acceleration factor different from the first acceleration factor, wherein the first segment and the second segment are in a non-overlapping arrangement with respect to the readout direction; and
generate an MR image of the examination object based on k-space acquired in the first segment and the second segment.

* * * * *